(12) United States Patent
Zhao et al.

(10) Patent No.: US 6,819,200 B2
(45) Date of Patent: Nov. 16, 2004

(54) BROADBAND BALUN AND IMPEDANCE TRANSFORMER FOR PUSH-PULL AMPLIFIERS

(75) Inventors: Lei Zhao, Chandler, AZ (US); Anthony M. Pavio, Paradise Valley, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/206,164

(22) Filed: Jul. 26, 2002

(65) Prior Publication Data

US 2004/0017266 A1 Jan. 29, 2004

(51) Int. Cl.[7] .............................................. H03H 5/00
(52) U.S. Cl. ............................. 333/26; 333/25; 333/32; 333/33
(58) Field of Search ........................ 333/25–26, 32–33

(56) References Cited

U.S. PATENT DOCUMENTS

| | | | | |
|---|---|---|---|---|
| 3,714,597 A | * | 1/1973 | Reynolds | 330/275 |
| 5,061,910 A | * | 10/1991 | Bouny | 333/26 |
| 5,565,881 A | * | 10/1996 | Phillips et al. | 343/859 |
| 5,594,629 A | * | 1/1997 | Steigerwald | 363/21.14 |
| 5,661,647 A | * | 8/1997 | Washburn et al. | 363/147 |
| 5,767,754 A | * | 6/1998 | Menna | 333/25 |
| 6,100,772 A | * | 8/2000 | Decramer et al. | 333/25 |
| 6,388,539 B1 | * | 5/2002 | Rice | 333/25 |
| 6,441,696 B1 | * | 8/2002 | Westberg | 333/26 |
| 2003/0157918 A1 | * | 8/2003 | Gamliel | 455/326 |

OTHER PUBLICATIONS

Chen, T., Chang, K. W., Bui, Stacey B., Wang, H., Dow, G. S., Liu, L. C. T., Lin, T. S. and Titus, W. S., "Broadband Monolithic Passive Baluns and Monolithic Double–Balanced Mixer" IEEE vol. 39, No. 12, Dec. 1991.

* cited by examiner

*Primary Examiner*—Michael Tokar
*Assistant Examiner*—Khai Nguyen

(57) ABSTRACT

A balun and transformer system (201) is provided in which a balun (112) is cascaded between two 4:1 impedance transformers (102, 110) to form a 16:1 broadband impedance transformation for push-pull amplifier applications (200). The balun (112) is configured in a Marchand configuration. The balun and transformers (201) are formed with coupled lines realized with a very thin layer of ceramic. Additional coupling between the gap in the balun (112) is achieved by an embedded capacitor (260) built in the balun's ceramic. DC bias supply (294, 296) to the power amplifier (106) is achieved by using the hot plate of decoupling capacitors (298, 299), which serve as a floating ground plane to the whole application (200).

9 Claims, 3 Drawing Sheets

US 6,819,200 B2

BROADBAND BALUN AND IMPEDANCE TRANSFORMER FOR PUSH-PULL AMPLIFIERS

FIELD OF THE INVENTION

This invention relates generally to balun and impedance transformers and more specifically to broadband balun and impedance transformers for push-pull amplifiers.

BACKGROUND OF THE INVENTION

Broadband push-pull power amplifiers have the advantage of higher output power (twice that of a single-ended amplifier) with even harmonic cancellation and high efficiency. For push-pull power amplifiers to work properly, a broadband balun with excellent amplitude and phase balance is needed. Additionally, for practical amplifier designs, an impedance transformer that can transform low impedances (e.g. 3 to 4 ohm) to an external load impedance (e.g. 50 ohm) over, for example, a 700 MHz to 2.4 GHz frequency range is required. The balun/transformer also needs to provide DC biasing to the push-pull amplifier.

Many prior art power amplifier applications address the need for a transformer but not the need for a balun, while many mixer applications address the design of baluns that cannot be used in conjunction with an impedance transformer. A balun is used mainly to connect a balanced source to an unbalanced load, or vice versa, and a balun typically provides no impedance transforming function.

Accordingly, it would be desirable to have a combination of impedance transformer and balun to create a broadband impedance transformation while at the same time being able to provide balanced differential ports for push-pull amplifier applications.

BRIEF DESCRIPTION OF THE DRAWINGS

The present invention is illustrated by way of example and not limitation in the accompanying figures, in which like references indicate similar elements, and in which.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

In accordance with the present invention, there will be described herein a balun and transformer system in which a balun is cascaded between two 4:1 impedance transformers to form a 16:1 broadband impedance transformation for push-pull amplifier applications.

Figure 1:
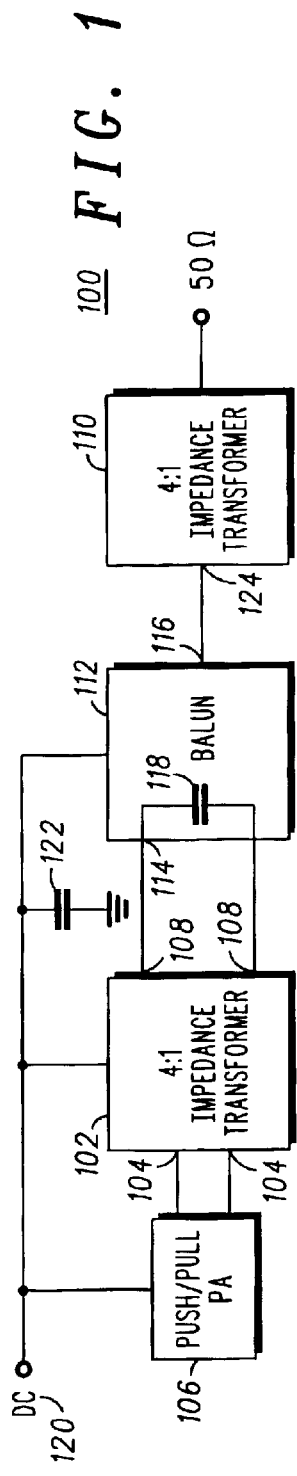
FIG. 1 is a block diagram of a broadband balun and impedance transformer system for a push-pull amplifier in accordance with the present invention.

Referring now to FIG. 1, there is shown a block diagram of a broadband balun and impedance transformer system for a push-pull amplifier in accordance with the present invention. System 100 includes a first 4:1 impedance transformer 102 having a differential input port 104 for receiving a differential input signal from the power amplifier 106 and generating a differential output signal at differential output port 108.

System 100 further includes a second 4:1 impedance transformer 110 and a balun 112 cascaded between the first and second 4:1 impedance transformers 102, 110. The balun 112 provides a differential input port 114 and a single-ended output port 116. A coupling capacitor 118 is coupled across the balun's differential input port 114 to provide additional coupling across the gap between transmission lines (to be shown in FIG. 2). DC bias 120 is applied to the first 4:1 transformer 102 and the balun 112. A decoupling capacitor 122 is coupled to the DC bias 120 to provide a floating ground plane for the impedance transformer and the balun. The first 4:1 transformer 102 converts, for example an input impedance of 3–4 ohms at each input port 104 to an output impedance of approximately 12.5 ohms at each output port 108. The balun 112 connects the balanced differential input to an unbalanced load. The balun of the present invention can provide a small impedance transformation (e.g. 8 ohm to 13 ohm) by adding matching networks at the output port of the balun as will be described later. The second 4:1 transformer 110 converts the single-ended port impedance of 12.5 ohms to a single-ended output port impedance of approximately 50 ohms.

Figure 2:
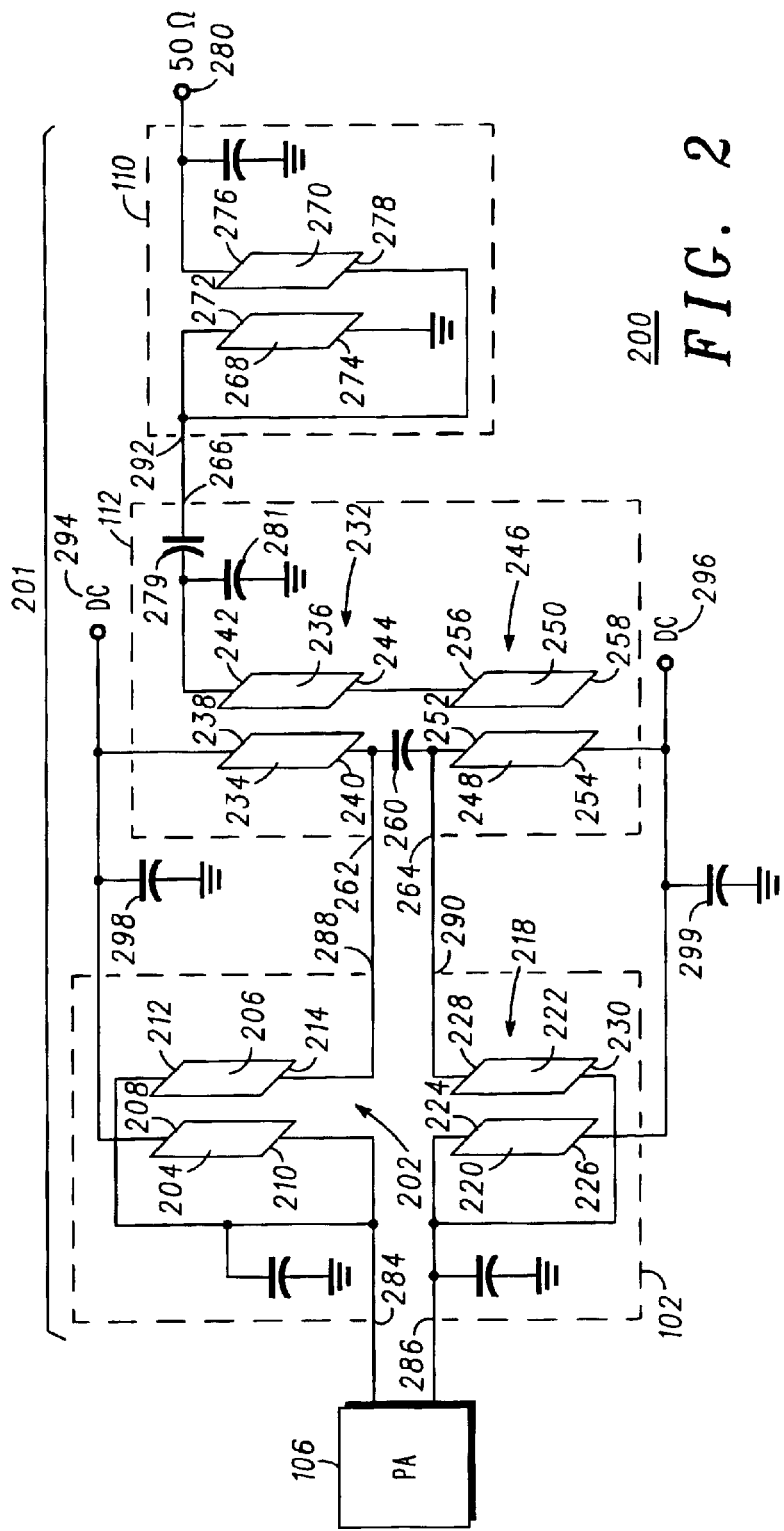
FIG. 2 is a schematic diagram of the broadband balun and impedance transformer system of FIG. 1 implemented in accordance with a preferred embodiment of the invention.

Referring now to FIG. 2, there is shown an implementation of the system of FIG. 1, in accordance with a preferred embodiment of the invention. The balun and impedance transformer system 201 includes 4:1 impedance transformer 102, balun 112, and second 4:1 impedance transformer 110 cascaded in series and coupled to the push/pull amplifier 106.

In accordance with the preferred embodiment, the first 4:1 impedance transformer 102 is formed as a first transmission line coupler 202 and second transmission line coupler 218. The first transmission line coupler 202 is formed of first and second adjacent, or co-located, transmission lines 204, 206 coupled on parallel planes of a substrate. The first transmission line has first and second opposed terminals 208, 210 and the second transmission line 206 has third and fourth opposed terminals 212, 214. The first and fourth terminals 208, 214 are diagonally opposed. The first terminal 208 is DC biased 294. The second terminal 210 provides an input port 284, while the third terminal 212 is shorted to the second terminal 210, and the fourth terminal 214 provides a first output port 288.

In accordance with the preferred embodiment, the first 4:1 impedance transformer's second transmission line coupler 218 is formed of third and fourth adjacent, or co-located, transmission lines 220, 222 coupled on parallel planes. The third transmission line 220 has first and second opposed terminals 224, 226, and the fourth transmission line 222 has third and fourth opposed terminals 228, 230. The first terminal 224 of the third transmission line 220 provides a second input port 286 while the second terminal 226 of the third transmission line 220 is DC biased 296. The third terminal 228 of fourth transmission line 222 provides a second output port 290, and the fourth terminal 230 of the fourth transmission line 222 is short circuited to the second input port 286. Each transmission line of the first 4:1 impedance transformer 102 is about one eighth wavelength at the center of the operating band. In accordance with the preferred embodiment, the first and second input ports 284, 286 of the first 4:1 impedance transformer 102 provide two balanced differential ports for a push-pull amplifier 106.

In accordance with the preferred embodiment, the balun 112 is formed of a first transmission line coupler 232 and second transmission line coupler 246. The first transmission line coupler 232 is formed of first and second adjacent, or co-located, transmission lines 234, 236 on parallel planes. The first transmission line 234 has first and second opposed terminals 238, 240 and the second transmission line 236 has third and fourth opposed terminals 242, 244.

The second transmission line coupler 246 is formed of third and fourth adjacent, or co-located, transmission lines 248, 250 on parallel planes. The third transmission line 248 has first and second opposed terminals 252, 254, while the fourth transmission line 250 has third and fourth opposed terminals 256, 258.

In accordance with the preferred embodiment, the balun's first terminal 238 of the first coupler 232 and the second terminal 254 of the second coupler 246 are DC biased at 294, 296. The second terminal 240 of the first coupler 232 and the first terminal 252 of the second coupler 246 are capacitively coupled through a capacitor 260 and provide first and second input ports 262, 264 for the balun 112. The fourth terminal 244 of the first coupler 232 and the third terminal 256 of the second coupler 246 are shorted together. The fourth terminal 258 of the second coupler 246 is open circuited. The third terminal 242 of the first coupler 232 is coupled to a series capacitor 279 and shunt capacitor 281, leading to a single-ended output port 266. The shunt to ground capacitor 281 and the series capacitor 279 are used for impedance matching. The transformation ratio is normally small and is used for optimizing the design. Each transmission line of the balun 112 is approximately a quarter wavelength at the center of the operating band.

In accordance with the preferred embodiment, the second 4:1 impedance transformer 110 is formed of first and second adjacent, or co-located, transmission lines 268, 270 on parallel planes. The first transmission line 268 is formed of first and second opposed terminals 272, 274. The second transmission line 270 is formed of third and fourth opposed terminals 276, 278. The first and fourth terminals 272, 278 are diagonally opposed and shorted together and coupled to the balun's output port 266. The second terminal 274 is grounded, and the third terminal 276 provides an output port 280. Each transmission line 268, 270 of the second 4:1 impedance transformer is about one eighth wavelength at the center of the operating band.

In accordance with the preferred embodiment, the balun and impedance transformer 200 provides a broadband impedance of 16:1, where the output port 280 is characterized by an impedance of substantially 50 ohms and the first and second input ports 284, 286 are each characterized by a low impedance of approximately 3 to 4 ohms.

Still referring to FIG. 2, a signal processing flow will next be described (also in conjunction with FIGS. 3, 4 and 5). In accordance with the preferred embodiment, a differential RF signal is generated by the push/pull power amplifier 106 and received by the first 4:1 impedance transformer's balanced input port 284, 286 having an impedance of, for example, 3–4 ohms. The differential RF signal is of equal amplitude and 180 degrees out of phase and is sent to the first 4:1 impedance transformer's balanced output port 288, 290 having an impedance of approximately 12.5 ohms. The voltage signal amplitude will measure twice that of the original amplitude, and the current signal amplitude will measure half that of the original amplitude. Thus, the input and output power will remain unchanged.

Next, the balun 112 receives the transformer's differential output signal at the balun's balanced differential input port 262, 264. The balun 112 is configured in a Marchand configuration, with an additional coupling capacitor 260 coupled across input port 262, 264. The balun 112 converts the differential balanced signals to a single-ended signal having twice the power. The balun 112 generates the single-ended signal and provides it to the single (unbalanced) ended output port 266.

Figure 3:
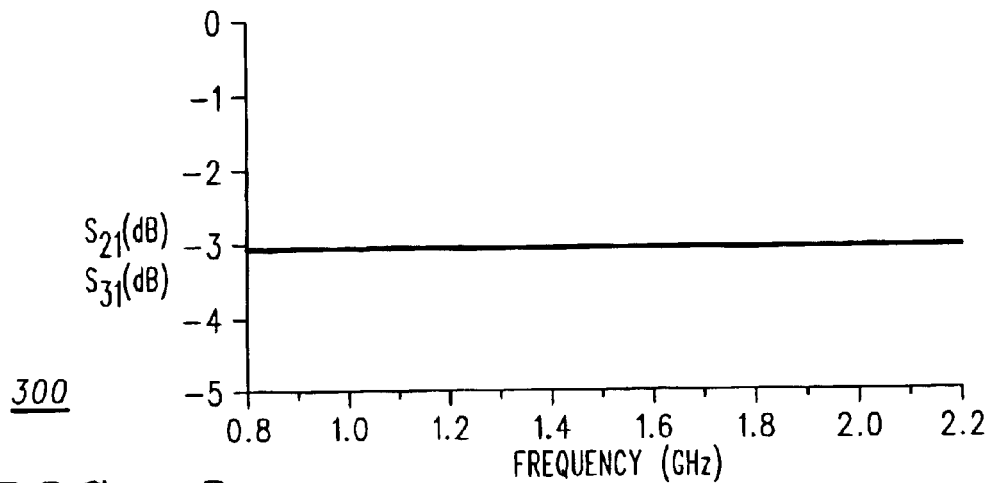
FIG. 3 is a graph depicting an example of the amplitude of the power transmission of the balun from the unbalanced port to the two balanced ports versus frequency in accordance with the preferred embodiment.
Figure 4:
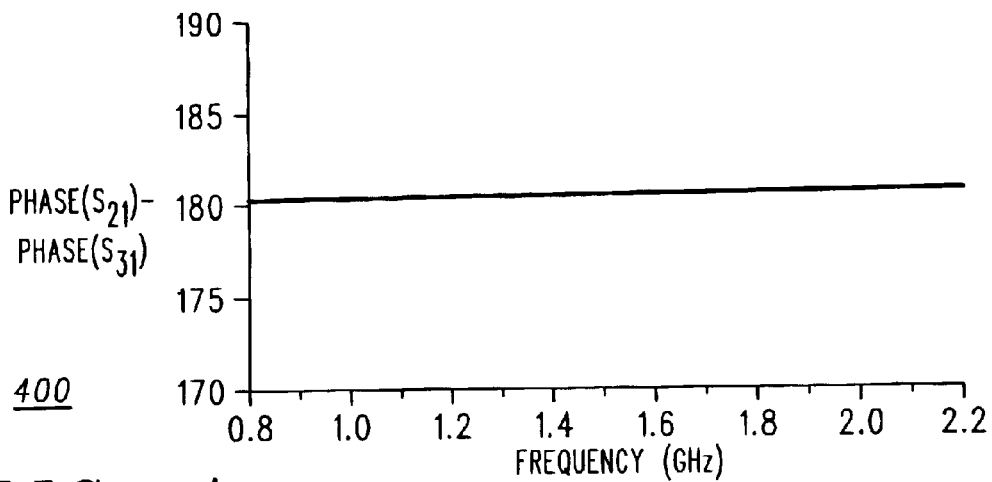
FIG. 4 is a graph depicting an example of the phase balance in the power transmission of the balun from the unbalanced port to the two balanced ports versus frequency in accordance with the preferred embodiment.
Figure 5:
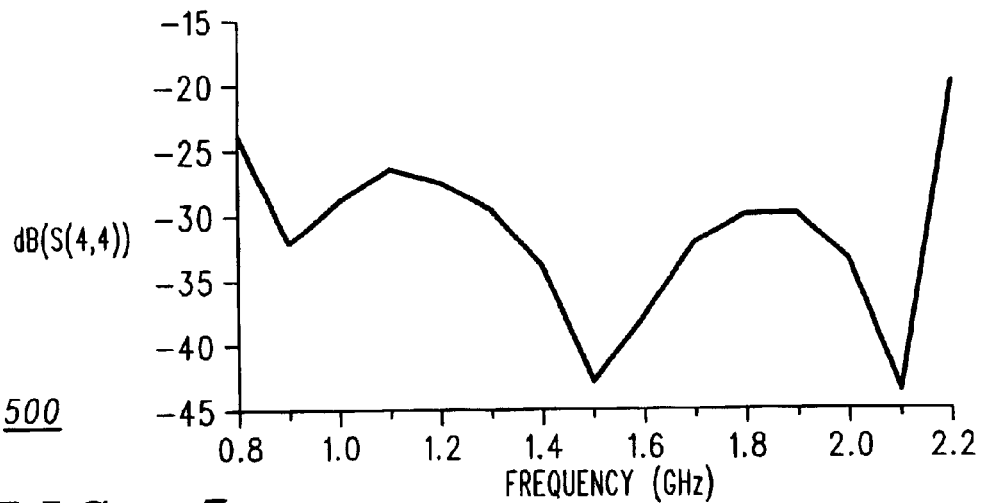
FIG. 5 is a graph depicting an example of the return loss of the balun at the unbalanced port when the two balanced ports are driven 180 degrees out of phase versus frequency in accordance with the preferred embodiment.

FIGS. 3, 4, and 5 are examples of data that can be achieved when the two balanced ports are driven with two equal amplitude signals that are out of phase with each other. FIG. 3 is a graph depicting an example of the amplitude of the power transmission (measured in dB) of the balun from the unbalanced port 266 to the two balanced ports 262, 264 versus frequency (measured in GHz). As can be seen from the graph 300, the amplitude of the power transmission measures −3 dB across the broadband frequency range of 0.8–2.2 GHz. FIG. 4 is a graph 400 depicting an example of the phase balance in the power transmission (measured in degrees) of the balun 112 from the unbalanced port 266 to the two balanced ports 262, 264 versus frequency (measured in GHz). As can be seen from this measurement, the phase balance remained 180 degrees across the broadband frequency range of 0.8–2.2 GHz. FIG. 5 is a graph depicting an example of the return loss (measured in dB) of the balun at the unbalanced port 266 when the input ports are resistively terminated (measured in GHz). As can be seen from this measurement, the return loss measured less than −20 dB across the broadband frequency range of 0.8–2.2 GHz.

Next, the RF signal output from the balun's single-ended output port 266 proceeds to the second 4:1 impedance transformer's single-ended input port 292 having an impedance of approximately 12.5 ohms. The RF signal is transformed through the transformer and output to the second impedance transformer's single-ended (unbalanced) output port 280 having an impedance of approximately 50 ohms. At this point 280 of the circuit, the RF power is doubled compared to the input power at 284 or 286.

The first 4:1 impedance transformer 102 and the balun 112 provide DC bias 294, 296 to the power amplifier 106 and further includes decoupling capacitors 298, 299 on the DC bias 294, 296 to serve as a floating ground plane for the transformer and the balun.

Figure 6:
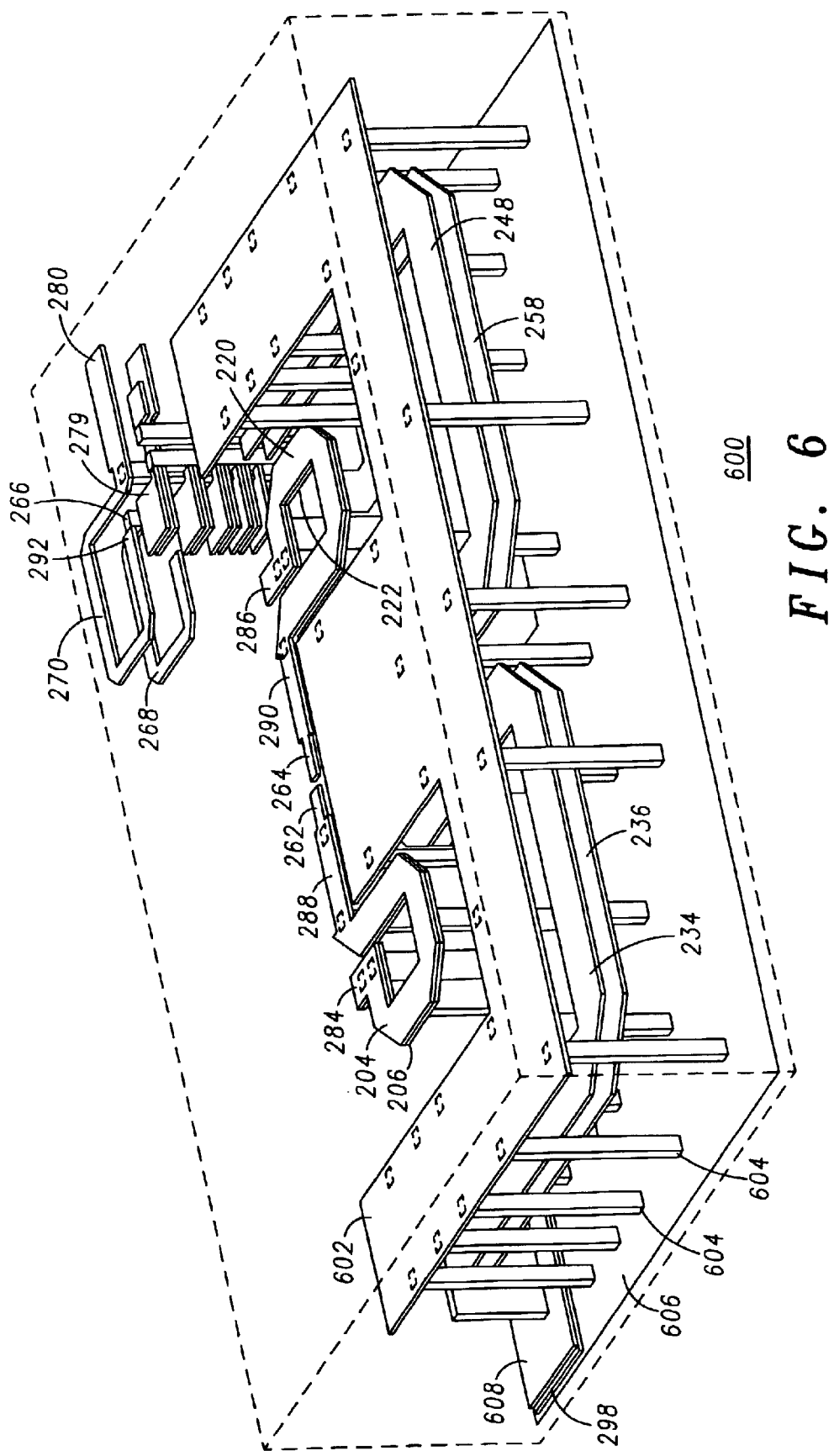
FIG. 6 is a perspective view of the balun/transformer in accordance with the preferred embodiment of the invention.

Referring now to FIG. 6, there is shown a perspective view of a structure 600 of a combination broadband balun and two 4:1 impedance transformers in accordance with the present invention. Similar designator numerals have been carried forward from the block diagram of FIG. 2 where possible. Not all coupling and decoupling capacitors are shown so that the transmission line portion of the structure can be viewed more clearly. In accordance with the preferred embodiment, the first 4:1 impedance transformer, the balun, and the second 4:1 impedance transformer are formed using LTCC (Low Temperature Cofired Ceramics) technology with coupled lines realized with a very thin layer of ceramic. The capacitors are preferably embedded in the balun's ceramic. A capacitor's thickness depends on the number of plates used in the design and the area of each plate. A thin tape of 1-mil thickness can make the capacitor compact as compared to a 4-mil tape.

Structure 600 includes top ground plane 602 contoured for the balun transmission lines below. The top ground plane 602 is coupled through vias 604 to a bottom ground plane 606 (shown only as a partial outline for simplicity). A first 4:1 transformer includes first differential input 284, 286 and proximately coupled transmission lines 204, 206 and proximately coupled transmission lines 220, 222. In this structure the transmission lines are about one eighth wavelength at the center of the frequency band. The first 4:1 transformer shows differential output 288 coupled through to the balun's differential input 262 while differential output 290 is coupled to the balun's differential input 264.

The balun is represented by two sets of transmission lines 234, 236 and 248, 258. Decoupling capacitors 298, (and 299 not shown) provide a floating ground plane. DC bias supply to the power amplifier (not shown) is achieved by using a hot plate 608 of the de-coupling capacitor 298 (299 not shown), which serves as a floating ground plane to the whole structure.

Coupling capacitor 260 (not shown) is embedded in the ceramic across the balun's differential input port 262, 264 between transmission lines 234, 248. The balun's series capacitor 279 is coupled to the balun's single-ended output port 266. The second 4:1 transformer has an input port 292 coupled to the balun's single-ended output port 266. The second 4:1 transformer is formed of transmission lines 268, 270 and provides single-ended output port 280.

The structure 600 shown and described by FIG. 6 can thus transform low impedances of 3 to 4 ohm to an external load impedance of 50 ohms over, for example, a 700 MHz to 2.4 GHz frequency range. The structure provides excellent amplitude and phase balance while providing DC biasing for a push-pull amplifier.

The balun/impedance transformer 600 of the present invention has been described as being implemented using Low Temperature Cofired Ceramics (LTCC) technology due to the advantageous size and strong coupling capability of this technology. However, high density interconnect (HDI) technology which uses organic materials to build 3D structures can also provide the capability to build thin layers and would be an acceptable alternative to the LTCC structure.

Accordingly, there has been provided a combination of balun, with two 4:1 impedance transformers to create a broadband impedance transformation of 16:1 while at the same time providing two balanced differential ports for push-pull amplifier applications. Low voltage push-pull power amplifiers, such as those used in software definable radios and cellular handsets, can benefit from this combination of balun/transformer In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential features or elements of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

We claim:

1. A balun and impedance transformer for a power amplifier, comprising:

a first 4:1 impedance transformer having a differential input port and a differential output port the differential input port coupled to the power amplifier;

a balun configured in a Marchand configuration, the balun having a differential input port with a coupling capacitor coupled therebetween and the balun having a single-ended output port, the balun's differential input port coupled to the differential output port of the first 4:1 impedance transformer;

a second 4:1 impedances transformer having a single-ended input port capacitively coupled to the balun's single-ended output port, the second 4:1 impedance transformer having a single-ended output port; and the first 4:1 impedance transformer, the balun and the second 4:1 impedance transformer are implemented using Low Temperature Cofired Ceramics (LTCC) technology, wherein the first 4:1 impedance transformer and the balun provide DC bias to the power amplifier and further comprising a decoupling capacitor on the DC bias to serve as a floating ground place.

2. The balun and impedance transformer of claim 1, wherein the balun and impedance transformer provides a 16:1 impedance conversion.

3. A balun/impedance transformer, comprising:

a 4:1 impedance transformer comprising:

a first transmission line coupler formed of first and second adjacent transmission lines, the transmission line having first and second opposed terminals and the second transmission line having third and fourth opposed terminals, the first and fourth terminals being diagonally opposed, the first terminal being DC biased, the second terminal being an input port, the third terminal being shorted to the second terminal, and the fourth terminal providing a first output port;

a second transmission line coupler formed of third and fourth adjacent transmission lines, the third transmission line having first and second opposed terminals, the fourth transmission line having third and fourth opposed terminals, the first terminal of the third transmission providing a second input port, the second terminal of the third transmission being DC biased, the third terminal of the fourth transmission line providing a second output port, and the fourth terminal of the fourth transmission line being short circuited to the second input port;

a balun formed of:

a first transmission line coupler formed of first and second adjacent transmission lines, the first transmission line having first and second opposed terminals and the second transmission line having third and fourth opposed terminals;

a second transmission line coupler formed of third and fourth adjacent transmission lines, the third transmission line having first and second opposed terminals, the fourth transmission line having third and fourth opposed terminals;

wherein the balun's first terminal of the first coupler and the second terminal of the second coupler am DC biased, the second terminal of the first coupler and the first terminal of the second coupler arm capacitively coupled through a capacitor and provide first and second input ports, the fourth terminal of the first coupler and the third terminal of the second coupler are shorted together, the fourth terminal of the second coupler being open circuited, and the third terminal of the first coupler providing a single-ended output port;

a second 4:1 impedance transformer formed of first and second adjacent transmission lines, the first transmission line formed of first and second opposed terminals, the second transmission line formed of third and fourth opposed terminals, the first and fourth terminals being diagonally opposed and capacitively coupled to the balun output port the second terminal being grounded, the third terminal providing an output port;

wherein the first and second input ports of the first 4:1 transformer provide two balance differential ports for a push-pull amplifer.

4. The balun/impedance transformer of claim 3, wherein the balun transformer provides a broadband impedance of 16:1.

5. The balun/impedance transformer of claim 3, wherein the output port is characterized by an impedance of substantially 50 ohms and the first and second input ports are each characterized by a low impedance of approximately 3 to 4 ohms.

6. The balun and impedance transformer of claim 3, wherein the balun and impedance transformer are implemented using Low Temperature Cofired Ceramics (LTCC) technology.

7. The balun and impedance transformer of claim 3, wherein the balun and impedance transformer are implemented using High Density Interconnect (HDI) technology.

8. A balun and impedance transformer for a push-pull amplified, comprising:

a first 4.1 impedance transformer for receiving a differential input and generating a differential output;

a second 4:1 impedance transformer, a balun cascaded between the first and second 4:1 impedance transformers, the balun having a differential input port and a single-ended output port;

a coupling capacitor across the balun differential input port;

DC bias applied to the first 4:1 transformer and the balun;

a decoupling capacitor coupled to the DC bias to provide a floating ground plant with the push-pull amplifier; and the balun and first and second 4:1 impedance transformers arm implemented using Low Temperature Cofired Ceramics (LTCC) technology.

9. The balun and impedance transformers of claim 8, wherein the balun and first and second 4:1 impedance transformers are implemented using High Density Interconnect (HDI) technology.

* * * * *